US007120413B2

(12) United States Patent
Lee et al.

(10) Patent No.: US 7,120,413 B2
(45) Date of Patent: Oct. 10, 2006

(54) TELEVISION TUNER AND METHOD OF PROCESSING A RECEIVED RF SIGNAL

(75) Inventors: Liang-Hui Lee, Tai-Nan (TW); Dsun-Chie Twu, Hsin-Chu Hsien (TW); Tung-Ming Su, Kao-Hsiung Hsien (TW)

(73) Assignee: Realtek Semiconductor Corp., HsinChu (TW)

( * ) Notice: Subject to any disclaimer, the term of this patent is extended or adjusted under 35 U.S.C. 154(b) by 330 days.

(21) Appl. No.: 10/708,060

(22) Filed: Feb. 6, 2004

(65) Prior Publication Data

US 2005/0001937 A1 Jan. 6, 2005

Related U.S. Application Data

(63) Continuation-in-part of application No. 10/707,319, filed on Dec. 4, 2003, and a continuation-in-part of application No. 10/604,018, filed on Jun. 22, 2003, now Pat. No. 6,999,747.

(51) Int. Cl.
*H04B 1/06* (2006.01)

(52) U.S. Cl. .................. 455/260; 455/180.3; 348/731; 375/376

(58) Field of Classification Search ................ 455/131, 455/179.1, 180.1, 180.2, 180.3, 188.1, 190.1, 455/255, 260; 348/725, 731; 375/373, 375, 375/376
See application file for complete search history.

(56) References Cited

U.S. PATENT DOCUMENTS 4,320,536 A 3/1982 Dietrich
4,581,643 A 4/1986 Carlson
5,325,129 A 6/1994 Henry et al.
5,517,687 A 5/1996 Niehenke et al.
5,589,791 A 12/1996 Gilbert
5,737,035 A 4/1998 Rotzoll
5,742,357 A 4/1998 Griesbaum
5,802,447 A * 9/1998 Miyazaki ..................... 455/76
5,826,182 A 10/1998 Gilbert
5,847,612 A * 12/1998 Birleson ..................... 455/260
6,028,493 A * 2/2000 Olgaard et al. ............. 375/308
6,029,059 A 2/2000 Bojer
6,091,303 A * 7/2000 Dent .......................... 375/376
6,122,497 A 9/2000 Gilbert
6,127,962 A 10/2000 Martinson
6,177,964 B1 1/2001 Birleson et al.
6,243,569 B1 * 6/2001 Atkinson .................... 455/260
6,307,894 B1 10/2001 Eidson et al.
6,480,236 B1 11/2002 Limberg
6,496,229 B1 12/2002 Limberg
6,724,440 B1 4/2004 Suan et al.
6,724,441 B1 4/2004 Choi
6,725,463 B1 4/2004 Birleson (Continued)

*Primary Examiner*—Quochien B. Vuong
(74) *Attorney, Agent, or Firm*—Winston Hsu

(57) ABSTRACT

A television (TV) tuner includes a first mixer for mixing a received RF signal with a first local oscillator signal to produce an intermediate frequency signal, a second mixer for mixing the intermediate frequency signal with a second local oscillator signal for producing an in-phase baseband output signal, a third mixer for mixing the intermediate frequency signal with a third local oscillator signal for producing a quadrature-phase baseband output signal, the third local oscillator signal being the second local oscillator signal phase delayed, and a single phase locked loop (PLL) coupled to the first mixer and the second mixer unit for generating the first local oscillator signal and the second local oscillator signal according to a selected channel in the received RF signal.

15 Claims, 4 Drawing Sheets

U.S. PATENT DOCUMENTS 6,888,580 B1 5/2005 Dujmenovic
6,995,808 B1 2/2006 Kovacic et al.
6,999,747 B1 2/2006 Su
7,006,162 B1 2/2006 Cowley et al.
7,019,598 B1 3/2006 Duncan et al.
7,019,790 B1 3/2006 Yamamoto
2005/0235333 A1 10/2005 Bertonis et al.

* cited by examiner

TELEVISION TUNER AND METHOD OF PROCESSING A RECEIVED RF SIGNAL

CROSS REFERENCE TO RELATED APPLICATIONS

This is a copending application to application Ser. No. 10/604,018, filed on Jun. 22, 2003, entitled "Passive Harmonic Mixer" and assigned to the same assignee, the contents of which are incorporated herein by reference. This is also a continuation-in-part application to application Ser. No. 10/707,319, filed on Dec. 4, 2003, entitled "Harmonic Mixer Based Television Tuner And Method of Processing a Received RF Signal" and assigned to the same assignee, the contents of which are incorporated herein by reference.

BACKGROUND OF INVENTION

1. Field of the Invention

The invention relates to television tuners, and more particularly, to a television tuner having a single phase-locked loop used to process a received RF signal.

2. Description of the Prior Art

One of the most significant costs in television manufacturing is the cost of the tuner. Furthermore, with the increasing desire to integrate TV functions into personal computer (PC) systems and other electronic devices, the cost of the tuner needs to be reduced. TV tuners may be fabricated on circuit boards and then installed in personal computer systems, thereby allowing the PC to function as a television set. These tuners convert a radio frequency television signal into a baseband (or low frequency) video signal, which can then be passed on to other elements in the PC for video processing applications.

FIG. 1 shows an integrated television tuner 100 as disclosed by Rotzoll in U.S. Pat. No. 5,737,035. The television tuner 100 includes an on-chip circuit 102 in addition to an external off-chip band-pass filter 104. The on-chip circuit 102 includes an adjustable low-noise amplifier (LNA) 106, a first mixer 108, a second mixer 110, a second intermediate frequency amplifier 112, a plurality of first voltage controlled oscillators (VCOs) 114, a first phase-locked loop (PLL) 116, a second VCO 118, and a second PLL 120.

The adjustable LNA 106 amplifies a selected channel in a received RF signal (RF_in), and the first mixer 108 mixes the result with a first local oscillator signal LO1 to up-convert the selected channel to a constant frequency at a first intermediate frequency signal IF1, which is typically at 1220 MHz. To perform this task at a plurality of different selected channel frequencies, the first local oscillator signal LO1 must have a wide frequency range to allow different channels at different frequencies to be up-converted. Thus, a plurality of VCOs 114 must be used. Each VCO has a smaller frequency range and therefore a smaller resulting lower phase noise. The first PLL 116 is used to select the appropriate VCO and to control the frequency of the selected VCO to thereby generate the first local oscillator signal LO1.

The resulting first intermediate frequency signal IF1 is filtered by the off-chip band-pass filter 104 then mixed by the second mixer 110 with a second local oscillating signal LO2 to produce an output signal, which is typically a second intermediate frequency signal at 44 MHz. The second PLL 116 is used to control the frequency of the second local oscillator signal LO2, which is typically set to 1176 MHz. As the mixer 110 would also mix an image signal located at 1132 MHz with the second local oscillator signal LO2 (1176 MHz) to produce an output signal at 44 MHz, the first intermediate frequency signal IF1 is first filtered by the off-chip band-pass filter 104 to partly remove the image signal. Furthermore, the second mixer 110 is implemented as an image rejection type mixer to further prevent the image signal from appearing in the output signal IF2 and degrading the performance of the television tuner 100. Additionally, because the output signal IF2 of the television tuner 100 is not at baseband, an additional frequency conversion stage is needed (not shown). This additional frequency conversion stage requires at least one additional mixer, a third VCO, and a third PLL to control the frequency of the third VCO.

The use of the off-chip band-pass filter 104, the special image rejection mixer for the second mixer 110, and the multiple PLLs to control the frequencies of each local oscillator signal significantly increases the cost and the complexity of the television tuner 100. Accordingly, a need exists for a television tuner not having these requirements in order to reduce the cost and simplify the design.

SUMMARY OF INVENTION

One objective of the claimed invention is therefore to provide a television tuner having a single phase locked loop (PLL), to solve the above-mentioned problems.

According to the claimed invention, a television (TV) tuner is disclosed comprising: a first mixer for mixing a selected RF signal with a first local oscillator signal to produce an intermediate frequency signal, wherein the selected RF signal is selected via varying the first local oscillator signal; a second mixer unit for mixing the intermediate frequency signal with a second local oscillator signal for producing an output signal; and a phase locked loop (PLL) coupled to the first mixer and the second mixer for generating the first local oscillator signal and the second local oscillator signal according to the selected RF signal, wherein the first local oscillator signal and the second local oscillator signal are generated by a single first voltage controlled oscillator (VCO) and a single second VCO respectively.

Also according to the claimed invention, a method is disclosed for processing a received RF signal. The method comprising: generating a first local oscillator signal using a single first voltage controlled oscillator (VCO) and a second local oscillator signal using a single second voltage controlled oscillator using a phase locked loop (PLL) according to a selected RF signal, wherein the selected RF signal is selected via varying the first local oscillator signal; mixing the selected RF signal with the first local oscillator signal to produce an intermediate frequency signal; and mixing the intermediate frequency signal with the second local oscillator signal to produce an output signal.

These and other objectives of the claimed invention will no doubt become obvious to those of ordinary skill in the art after reading the following detailed description of the preferred embodiment that is illustrated in the various figures and drawings.

DETAILED DESCRIPTION

Figure 1:
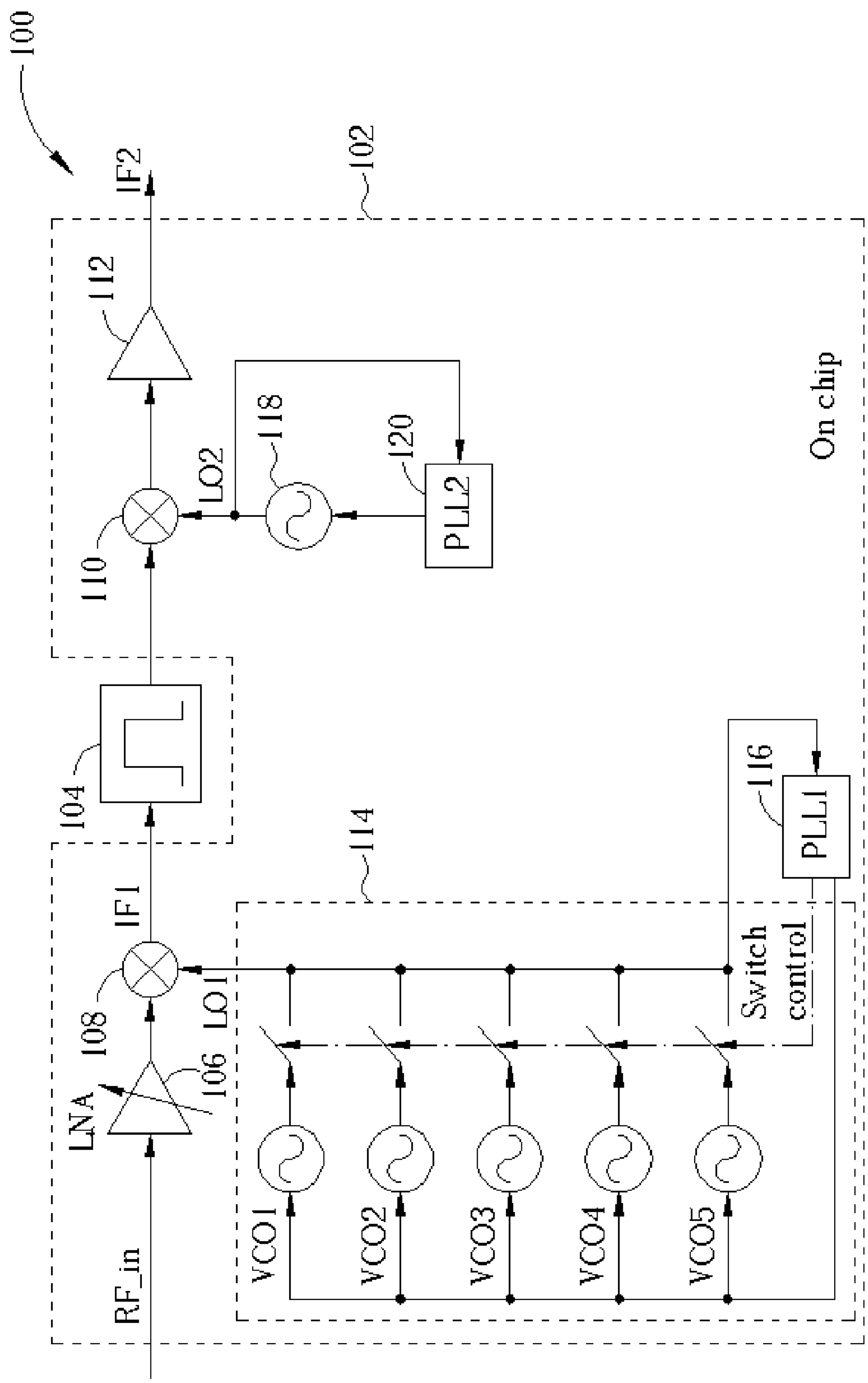
FIG. 1 is a block diagram of an integrated television tuner according to the prior art.
Figure 2:
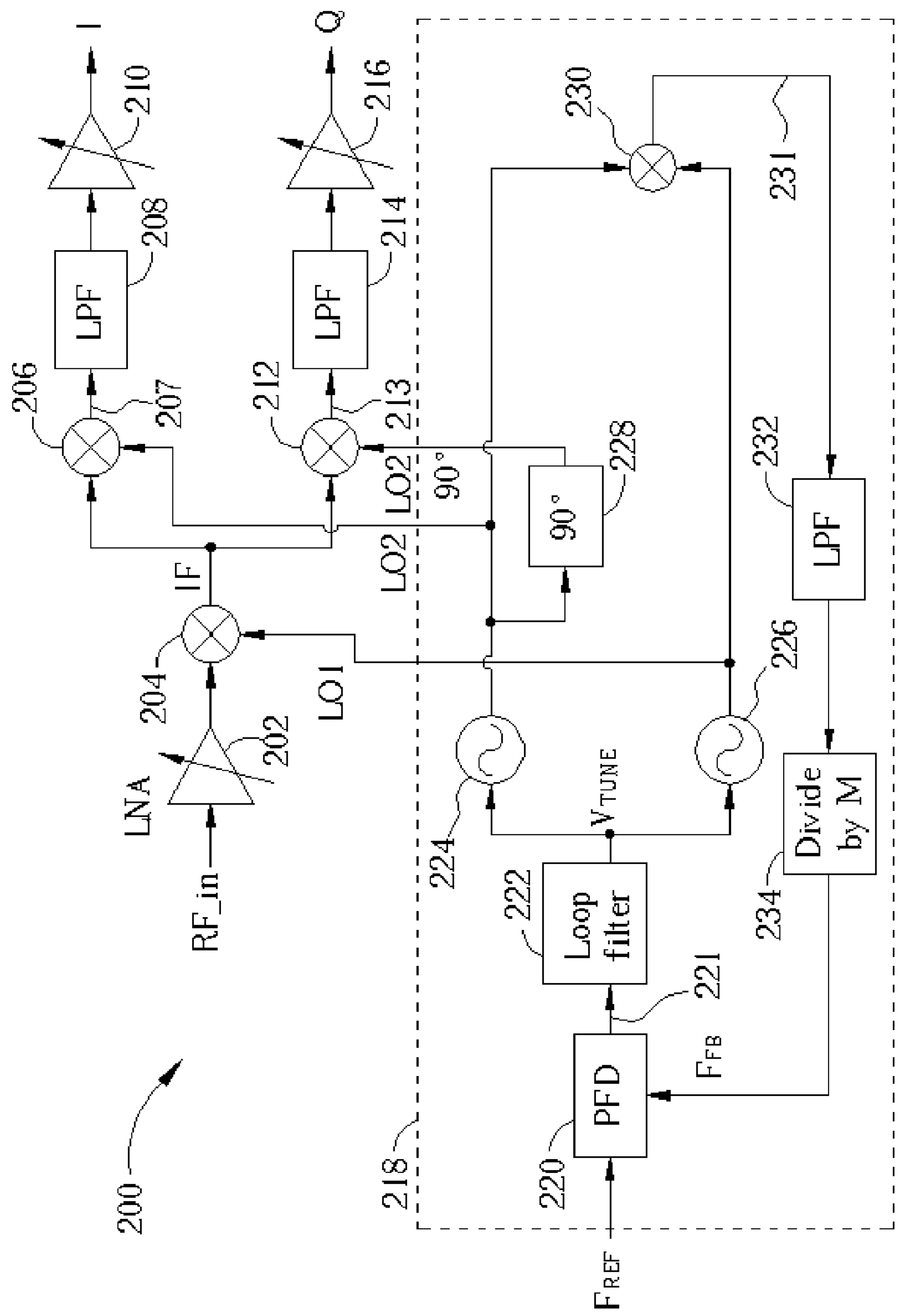
FIG. 2 is a block diagram of a first television tuner according to a first embodiment of the present invention.

FIG. 2 shows a block diagram of a first television tuner 200 according to a first embodiment of the present invention. The first television tuner 200 includes an adjustable low noise amplifier (LNA) 202, a first mixer 204, an in-phase mixer 206, an in-phase low-pass filter 208, an in-phase programmable gain amplifier 210, a quadrature-phase mixer 212, a quadrature-phase low-pass filter 214, a quadrature-phase programmable amplifier 216, and a single phase locked loop (PLL) 218. The PLL 218 includes a phase frequency detector (PFD) 220, a loop filter 222, a first voltage controlled oscillator 224, a second voltage controlled oscillator 226, a 90 degree phase-delay unit 228, a fourth mixer 230, a low-pass filter 232, and a divide by M feedback divider 234.

The adjustable LNA 202 amplifies a selected channel in a received RF signal (RF_in) and the first mixer 204 mixes the amplified RF signal with a first local oscillator signal LO1 to produce an intermediate frequency (IF) signal. The in-phase mixer 206 mixes the IF signal with a second local oscillator signal LO2 to produce an in-phase output signal 207. The in-phase low pass filter 208 filters the in-phase output signal 207 and the in-phase programmable gain amplifier 210 amplifies the output of the in-phase low-pass filter 208 to generate an in-phase baseband signal I. Similarly, the quadrature-phase mixer 212 mixes the IF signal with a 90 degree phase-delayed version of the second local oscillator signal LO2__90° to produce a quadrature-phase output signal 213. The quadrature-phase low pass filter 214 filters the quadrature-phase output signal 213 and the quadrature programmable gain amplifier 216 amplifies the output of the quadrature-phase low-pass filter 214 to generate a quadrature-phase baseband signal Q.

In the first embodiment of the present invention, the PLL 218 generates the first local oscillator signal (LO1), the second local oscillator signal LO2, and the 90 degree phase-delayed second local oscillator signal LO2__90° as follows. The PDF 220 compares the phase of a reference signal $F_{REF}$ and a feedback signal $F_{FB}$ and generates an associated error signal 221. The pulse width of the error signal indicates the magnitude of the phase difference between the reference signal $F_{REF}$ and the feedback signal $F_{FB}$. Depending on whether the reference signal $F_{REF}$ is faster than the feedback signal $F_{FB}$ or whether the feedback signal $F_{FB}$ is faster than the reference signal $F_{REF}$, as indicated by the error signal 221, charge is either added to or subtracted from capacitors in the loop filter 222. Essentially, the loop filter 222 operates as an integrator that accumulates a net charge corresponding to the error signal 221. The resulting loop-filter voltage $V_{TUNE}$ is applied to the first VCO 224 and the second VCO 226. The first and second VCOs224, 226 generate the first and second local oscillator signals LO1, LO2, respectively. In order to generate both the in-phase and the quadrature-phase output signal, the 90 degree phase-delay unit 228 is used phase delay the LO2 signal to generate the LO2__90° signal. It should be noted that in another embodiment of the present invention, the 90 degree phase-delay unit can be located outside the PLL circuit 228.

Formula 1 shows the relationship of the two local oscillator signals LO1, LO2 and the selected channel in the RF signal. In formula 1, RF is the frequency of the selected channel in the received signal, LO1 is the frequency of the first local oscillator signal, and LO2 is the frequency of the second local oscillator signal.

$$RF=LO1LO2 \quad \text{(formula 1)}$$

Accordingly, the first VCO 206 and the second VCO 207 have opposite responses to changes in the loop-filter voltage $V_{TUNE}$. For example, if the loop-filter voltage $V_{TUNE}$ increases, the frequency of the first local oscillator signal LO1 also increases while the frequency of the second local oscillator signal LO2 decreases. Formula 2 and formula 3 show how a VCO gain factor K relates the voltage change of the loop filter voltage $V_{TUNE}$ with the change in the frequencies of the first local oscillator signal .LO1 and the second local oscillator frequency .LO2, respectively.

$$.LO1\approx|K|^{*}.V_{TUNE} \quad \text{(formula 2)}$$

$$.LO2\approx(-|K|)^{*}.V_{TUNE} \quad \text{(formula 3)}$$

It should also be noted that the VCO gain factor K is not necessarily required to be the same for both the first VCO 224 and the second VCO 226 but just that the polarity of the response to a change in the loop-filter voltage $V_{TUNE}$ be inversely proportional. In another embodiment of the present invention, the first VCO 224 has a first VCO gain factor $K_1$, and the second VCO 226 has a second gain factor $K_2$, wherein $K_1\approx(-K_2)$.

The fourth mixer 230 mixes the first and second local oscillator signals LO1, LO2 to generate a result signal 231. The result signal 231 has an upper frequency component at (LO1+LO2) and a lower frequency component at (LO1 LO2). The low-pass filter 232 filters away the upper frequency component at (LO1+LO2). The lower frequency component at (LO1 LO2) is then divided by a divisor M at the feedback divider 234 according to the selected channel in the received RF signal RF_in. In this way, the feedback signal $F_{FB}$ for closed-loop PLL operation is generated. Formula 4 shows how the frequency of the selected channel in the RF signal RF_in is equal to the divisor M multiplied by the reference signal $F_{REF}$.

$$\text{Selected } RF \text{ channel frequency}=F_{REF}{}^{*}M \quad \text{(formula 4)}$$

The PDF 220 compares the phase of the FREF signal and the feedback signal FFB and a corresponding loop-filter voltage $V_{TUNE}$ is be applied to both the first and second VCOs 224, 226. Because of the closed loop structure of the PLL 218, the first VCO 224 and the second VCO 226 stabilize to generate the first local-oscillator signal LO1 and the second local-oscillator signal LO2 such that the (LO1 LO2) is M times greater than the reference signal $F_{REF}$. This corresponds to the selected channel in the RF signal RF_in. The first mixer 204 and the second and third mixers 206, 212 thereby down-convert the selected channel in the RF signal to the in-phase baseband signal I and the quadrature-phase baseband signal Q.

Figure 3:
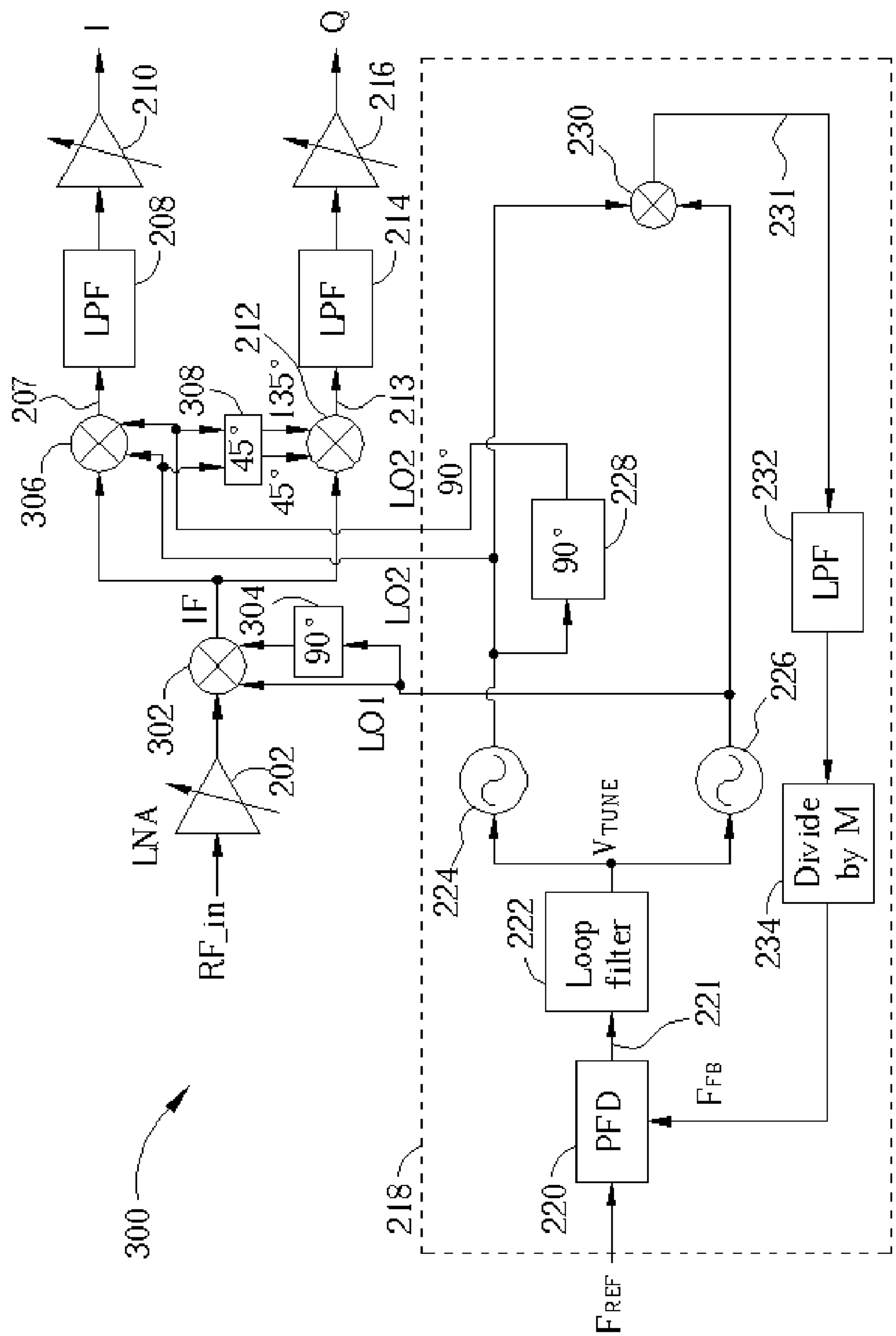
FIG. 3 shows a block diagram of a second television tuner according to a second embodiment of the present invention.

FIG. 3 shows a block diagram of a second television tuner 300 according to a second embodiment of the present invention. The second television tuner 300 includes similar components as the first television tuner 200 except the first mixer 204, the second mixer 206, and the third mixer 310 in FIG. 2 have been replaced by a first harmonic mixer 302, a second harmonic mixer 306, and a third harmonic mixer 310, respectively. Additionally, the second television tuner 300 further includes a second 90 degree phase-delay unit 304, and a 45 degree phase-delay unit 308. The second 90 degree phase-delay unit 304 generates a 90° phase-delayed version of the first local oscillator signal LO1 and both the first local oscillator signal LO1 and the 90° phase-delayed version are coupled to the first harmonic mixer 302. In the second embodiment, the second local oscillator signal LO2 and the 90° phase delayed second local oscillator signal LO2_90° are coupled to the second harmonic mixer 306. The 45 degree phase-delay unit 308 generates 45° and 135° phase-delayed versions of the second local oscillator signal LO2, which are coupled to the third harmonic mixer 310.

The first, second, and third harmonic mixers 302, 306, and 307, respectively, can be implemented as passive harmonic mixers. The operation, implementation, and benefits of harmonic mixers is explained incopending application Ser. No. 10/604,018 as filed on Jun. 22, 2003, entitled "Passive Harmonic Mixer" and assigned to the same assignee. Because harmonic mixers 302, 306, and 307 are used, the PLL 218 provides the first local oscillator signal LO1 and the second local oscillator signal LO2 having one half the frequency that is normally required. This further reduces the complexity of the PLL 218. The full operation and benefits of the harmonic architecture television tuner are further explained in copending application Ser. No. 10/707,319 as filed on Dec. $4^{th}$, 2003, entitled "Harmonic Mixer Based Television Tuner and Method of Processing a Received RF Signal" and assigned to the same assignee.

Figure 4:
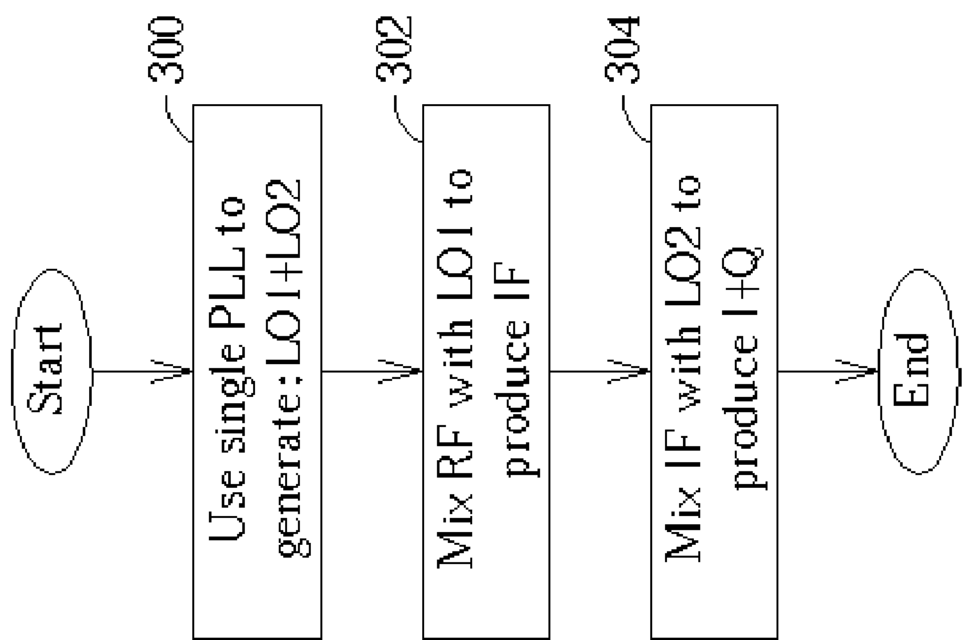
FIG. 4 is a flowchart describing a method of processing a received RF signal according to the present invention.

FIG. 4 is a flowchart describing a method of processing a received RF signal according to the present invention and contains the following steps:

Step 400: Use a single phase locked loop (PLL) circuit to generate both a first local oscillator signal LO1 and a second local oscillator signal LO2, wherein the frequency of the second local oscillator signal LO2 subtracted from the frequency of the first local oscillator signal LO1 equals the frequency of a selected channel in the received RF signal. Proceed to step 302.

Step 402: Mix the received RF signal with the first local oscillator signal LO1 to produce an intermediate frequency signal IF and proceed to step 304.

Step 404: Mix the intermediate frequency signal IF with the second local oscillator signal LO2 to produce an in-phase baseband signal and mix the intermediate frequency signal IF with a phase-delayed version of the second local oscillator signal LO2 to produce a quadrature-phase baseband signal.

According to this embodiment of the present invention, because the second mixer 206, 306 and the third mixer 212, 310 directly convert the first intermediate frequency signal IF to baseband, there is no image signal problem and no band-pass filter is required to remove the image signal. Additionally, the second mixer 206, 306 and the third mixer 212, 310 are not required to be special image rejection type mixers. Finally, a single PLL circuit 218 is used to generate the local oscillator signals LO1, LO2 used in the television tuner, which further reduces the component count and associated cost of the tuner.

Those skilled in the art will readily observe that numerous modifications and alterations of the device may be made while retaining the teachings of the invention. Accordingly, the above disclosure should be construed as limited only by the metes and bounds of the appended claims.

The invention claimed is:

1. A television (TV) tuner comprising:

a first mixer for mixing a selected RF signal with a first local oscillator signal to produce an intermediate frequency signal, wherein the selected RF signal is selected via varying the first local oscillator signal;

a second mixer unit for mixing the intermediate frequency signal with a second local oscillator signal for producing an output signal; and a phase locked loop (PLL) coupled to the first mixer and the second mixer for generating the first local oscillator signal and the second local oscillator signal according to the selected RF signal, wherein the first local oscillator signal and the second local oscillator signal are generated by a single first voltage controlled oscillator (VCO) and a single second VCO respectively.

2. The TV tuner of claim 1, wherein the frequency of the second local oscillator signal subtracted from the frequency of the first local oscillator signal is substantially equal to the frequency of the selected RF signal.

3. The TV tuner of claim 1, wherein the PLL comprises:

a phase frequency detector (PFD) for comparing a fixed reference signal with a feedback signal;

a loop filter for filtering the output of the PFD and producing a control voltage;

the single first voltage controlled oscillator (VCO) coupled to the control voltage for generating the first local oscillator signal according to the control voltage;

the second voltage controlled oscillator (VCO) coupled to the control voltage for generating the second local oscillator signal according to the control voltage;

a fourth mixer for mixing the first local oscillator signal with the second local oscillator signal; and a low-pass filter for filtering the output of the fourth mixer to produce the feedback signal.

4. The TV tuner of claim 3, wherein the PLL further comprises a feedback divider for dividing the frequency of the feedback signal by a divide ratio selected according to the selected received RF signal to produce a divided feedback signal to the phase frequency detector.

5. The TV tuner of claim 1, wherein the first mixer is a harmonic mixer and the first local oscillator signal includes a first reference signal and a second reference signal, the second reference signal being the first reference signal phase shifted by 90 degrees.

6. The TV tuner of claim 1, wherein the second mixer unit further includes an in-phase mixer for mixing the intermediate frequency signal with an in-phase second local oscillator signal for producing an in-phase baseband output signal, and a quadrature-phase mixer for mixing the intermediate frequency signal with an quadrature-phase second local oscillator signal for producing an quadrature-phase baseband output signal, wherein the quadrature-phase second local oscillator signal is the in-phase second local oscillator signal phase delayed by 90 degrees.

7. The TV tuner of claim 6, wherein the in-phase mixer and the quadrature-phase mixer are harmonic mixers;

the in-phase second local oscillator signal includes a first reference signal and a second reference signal being the first reference signal phase delayed by 90 degrees, and the quadrature-phase second local oscillator signal includes a third reference signal and a fourth reference signal, the third reference signal being the first reference signal phase shifted by 45 degrees, and the fourth reference signal being the first reference signal phase shifted by 135 degrees.

8. A method of processing a received RF signal, the method comprising:

generating a first local oscillator signal using a single first voltage controlled oscillator (VCO) and a second local oscillator signal using a single second voltage controlled oscillator using a phase locked loop (PLL) according to a selected RF signal, wherein the selected RF signal is selected via varying the first local oscillator signal;

mixing the selected RF signal with the first local oscillator signal to produce an intermediate frequency signal; and mixing the intermediate frequency signal with the second local oscillator signal to produce an output signal.

9. The method of claim 8, wherein the frequency of the second local oscillator signal subtracted from the frequency of the first local oscillator signal is substantially equal to the frequency of the selected RF signal.

10. The method of claim 8, wherein generating the first local oscillator signal and the second local oscillator signal according to the selected RF signal further comprises:

comparing a fixed reference signal with a feedback signal;

producing a control voltage by filtering the result of the comparing;

generating the first local oscillator signal according to the control voltage;

generating the second local oscillator signal according to the control voltage; mixing the first local oscillator signal with the second local oscillator signal; and filtering the output of the mixing to produce the feedback signal.

11. The method of claim 8, wherein generating the first local oscillator signal and the second local oscillator signal according to the selected RF signal further comprises: dividing the frequency of the feedback signal by a divide ratio according to the selected RF signal.

12. The method of claim 8, wherein the first local oscillator signal includes a first reference signal and a second reference signal, and mixing the received RF signal with the first local oscillator signal to produce an intermediate frequency signal comprises harmonically mixing the received RF signal with the first reference signal and the second reference signal, the second reference signal being the first reference signal phase shifted by 90 degrees.

13. The method of claim 8, the output signal further includes an in-phase baseband signal and a quadrature-phase baseband signal.

14. The method of claim 13, wherein the second local oscillator signal further includes an in-phase second oscillator signal and a quadrature-phase second oscillator signal being the in-phase second oscillator signal shifted by 90 degrees.

15. The method of claim 14, wherein the in-phase second oscillator signal further includes a first reference signal and a second reference signal being the first reference signal shifted by 90 degrees, and the quadrature-phase second local oscillator signal includes a third reference signal and a fourth reference signal, the third reference signal being the first reference signal phase shifted by 45 degrees, and the fourth reference signal being the first reference signal phase shifted by 135 degrees.

* * * * *